(12) United States Patent
Taniguchi et al.

(10) Patent No.: US 7,551,435 B2
(45) Date of Patent: Jun. 23, 2009

(54) HEAT-ABSORBING MEMBER, COOLING DEVICE, AND ELECTRONIC APPARATUS

(75) Inventors: Jun Taniguchi, Kawasaki (JP); Hiroki Uchida, Kawasaki (JP); Hideshi Tokuhira, Himeji (JP); Minoru Ishinabe, Kawasaki (JP); Masanobu Ishiduka, Kawasaki (JP); Hiroaki Date, Kawasaki (JP); Masatomo Asano, Yokohama (JP); Nobuhiro Nanri, Kobe (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/898,254

(22) Filed: Sep. 11, 2007

(65) Prior Publication Data

US 2008/0055860 A1 Mar. 6, 2008

Related U.S. Application Data

(63) Continuation of application No. PCT/JP2005/004345, filed on Mar. 11, 2005.

(51) Int. Cl.
*H05K 7/20* (2006.01)
*H01L 23/36* (2006.01)

(52) U.S. Cl. ........................ 361/687; 361/699; 361/702; 361/704; 361/715; 361/719; 165/80.3; 165/80.4; 165/104.33; 165/185; 257/714; 62/3.2

(58) Field of Classification Search ................ 361/679, 361/687, 702, 704, 705, 707, 709, 712–719, 361/721; 165/80.2, 80.3, 80.4, 80.5, 104.33, 165/104.21, 185; 257/706–727, 686; 174/15.1, 174/16.1, 16.3, 252
See application file for complete search history.

(56) References Cited

U.S. PATENT DOCUMENTS 4,933,808 A * 6/1990 Horton et al. ............... 361/715

(Continued)

FOREIGN PATENT DOCUMENTS

CN    1549675    11/2004

(Continued)

OTHER PUBLICATIONS

Korean Office Action dated Oct. 22, 2008 for Korean Patent Application No. 10-2007-7023124, along with partial English-language translation.

(Continued)

*Primary Examiner*—Michael V Datskovskiy
(74) *Attorney, Agent, or Firm*—Fujitsu Patent Center

(57) ABSTRACT

Electronic components differing in height (a CPU 2a, a capacitor 2b, and coil elements 2c) are mounted on a printed circuit board 1. A heat-absorbing member 3 is provided above the printed circuit board 1 in such a way that the member 3 contacts not only the top surface of the CPU 2a that is the shortest but the sides of the capacitor 2b and the coil elements 2c. To circulate a cooling medium, a flow path 4 is formed in the heat-absorbing member 3. Heat generated at the CPU 2a is transmitted from its top surface to the cooling medium in the flow path 4 via the heat-absorbing member 3; heat generated at the capacitor 2b and the coil elements 2c is transmitted from their sides to the cooling medium in the flow path 4 via the heat-absorbing member 3.

14 Claims, 11 Drawing Sheets

U.S. PATENT DOCUMENTS

| | | | | |
|---|---|---|---|---|
| 5,001,601 | A * | 3/1991 | Fuoco | 361/699 |
| 5,014,161 | A * | 5/1991 | Lee et al. | 361/709 |
| 5,325,265 | A * | 6/1994 | Turlik et al. | 361/702 |
| 5,648,890 | A * | 7/1997 | Loo et al. | 361/704 |
| 5,819,402 | A * | 10/1998 | Edwards et al. | 29/840 |
| 5,862,038 | A * | 1/1999 | Suzuki et al. | 361/704 |
| 6,496,373 | B1 * | 12/2002 | Chung | 361/705 |
| 6,501,164 | B1 * | 12/2002 | Chen et al. | 257/686 |
| 6,979,899 | B2 * | 12/2005 | Edwards | 257/704 |
| 7,050,304 | B2 * | 5/2006 | Hsu et al. | 361/719 |
| 7,057,896 | B2 * | 6/2006 | Matsuo et al. | 361/704 |
| 7,291,913 | B2 * | 11/2007 | Edwards | 257/704 |
| 2004/0217466 | A1 | 11/2004 | Lin | |

FOREIGN PATENT DOCUMENTS

| | | |
|---|---|---|
| JP | 51-17460 | 2/1976 |
| JP | 57-61985 U | 4/1982 |
| JP | 03-278596 A | 12/1991 |
| JP | 04-74489 U | 6/1992 |
| JP | 2536657 B | 9/1996 |
| JP | 2001-024372 A | 1/2001 |
| JP | 2002-232172 A | 8/2002 |
| JP | 2005-223099 A | 8/2005 |

OTHER PUBLICATIONS

"Chinese Office Action", CN1549675A is cited therein, mailed Mar. 13, 2009 in Chinese Patent Application No. 2005800490654.

* cited by examiner

FIG. 7
(a)
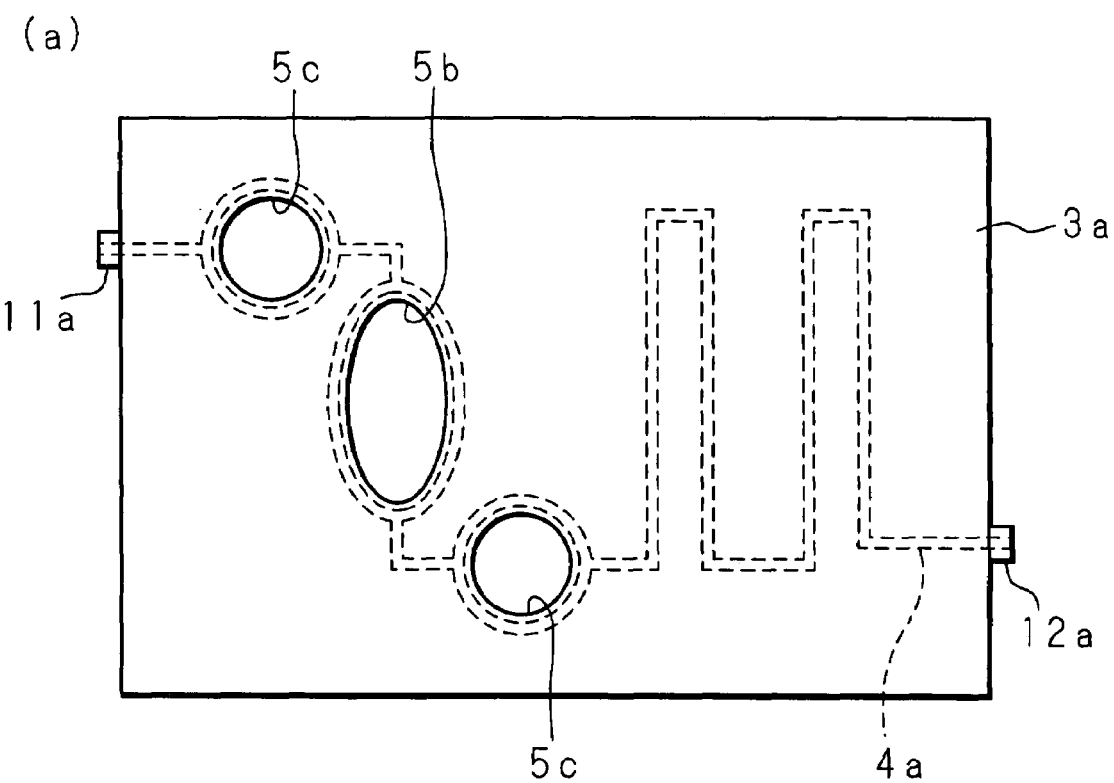
(b)
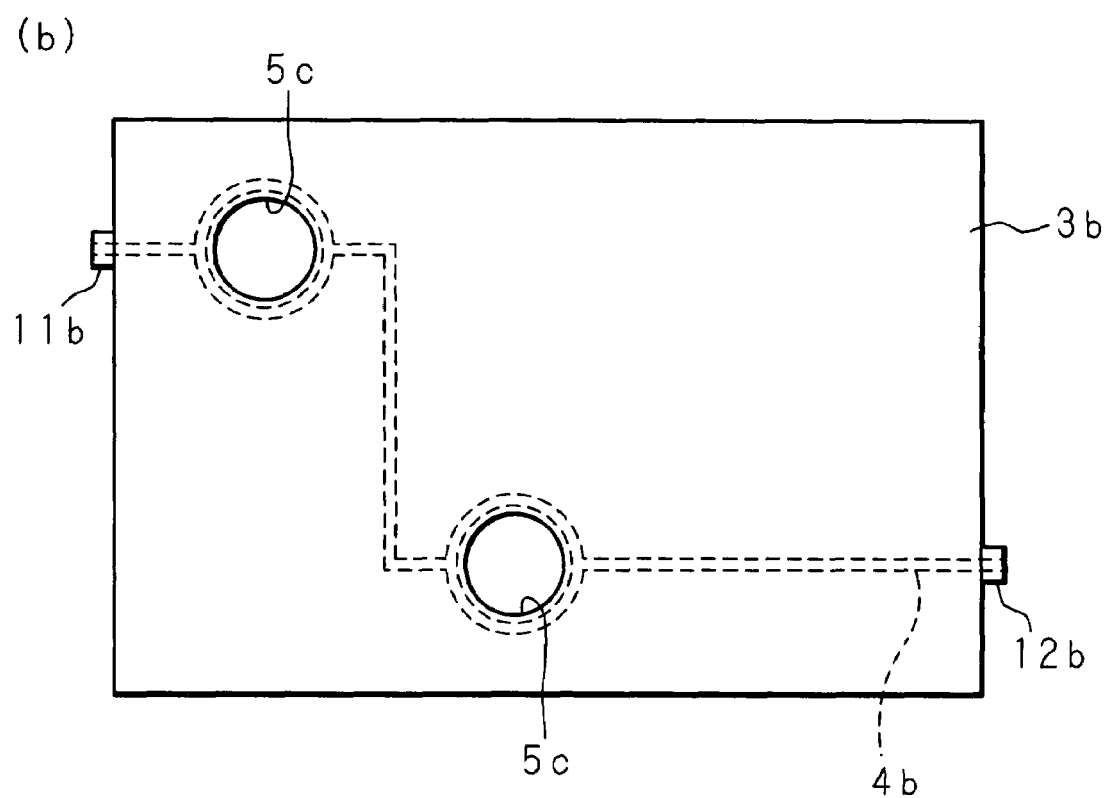

HEAT-ABSORBING MEMBER, COOLING DEVICE, AND ELECTRONIC APPARATUS

CROSS-REFERENCE TO RELATED APPLICATION

This application is a continuation application of and claims the benefit of International Application Number PCT/JP2005/004345, filed Mar. 11, 2005. The disclosure of the prior application is hereby incorporated herein in its entirety by reference.

TECHNICAL FIELD

The present invention relates to a heat-absorbing member that absorbs heat from plural electronic components, a cooling device that cools the electronic components that generate heat, and an electronic apparatus with the cooling device. More particularly, the invention relates to a heat-absorbing member and a cooling device that efficiently cool plural electronic components that differ in height when mounted on a substrate, and an electronic apparatus with the cooling device.

BACKGROUND ART

In electronic apparatus such as desktop computers, notebook computers, and mobile communication device, plural electronic components, such as a CPU, coil elements, and capacitors, are provided on a printed circuit board. As electronic apparatus operates faster and becomes more powerful and more sophisticated in functionality, there is a tendency for the calorific values of these electronic components in operation to increase in recent years. To maintain the stable operation of electronic apparatus, there is a need to improve their heat-release properties by quickly releasing heat generated at the electronic components to the outside.

Such being the case, electronic apparatus is generally provided with an air cooling device that cools these electronic components. Such a cooling device is provided with a heat sink that absorbs heat from the electronic components and then dissipates it and a cooling fan that sends cooling air to the heat sink. Since the calorific values of electronic apparatus are forecast to also continue to increase hereafter as described above, it is desired that measures be taken against the increase in the calorific value.

In air cooling devices, measures, such as upsizing of heat sinks and improvement in the performance of cooling fans, and so on, are taken to improve their cooling capability. However, in a case where large heat sinks are used, there is a problem that electronic apparatus also increases in size because of their incorporation. On the other hand, to improve the performance of cooling fans, there is a need to upsize them or increase their number of revolutions; however, such a method causes the problem that it is inevitable that electronic apparatus becomes large or their noise increases. In notebook computers in particular, portability, that is, their size and weight, as well as cooling capability, are important factors and silentness, that is, being silent during their operation is also an important factor; however, the above measures to improve cooling capability and these factors are mutually contradictory.

Therefore a liquid cooling system has been proposed that uses a liquid, such as water, having a specific heat that is higher by far than that of air as a cooling medium (see, for example, Patent Document 1).

In the cooling device for an electronic apparatus (notebook computer) disclosed in Patent Document 1, by connecting an electronic component provided to a main body, a radiator unit provided to a display unit, and a pump provided to the main body one after the other through the use of a pipe and circulating a cooling medium through the pipe, heat from the electronic component is transmitted to the radiator unit. In such a case, a method is generally used in which a plate-shaped heat-absorbing member is provided on the top surface of the electronic component and heat absorbed by the heat-absorbing member is dissipated into the cooling medium flowing through the pipe formed in the heat-absorbing member so that the heat can be efficiently released from the electronic component to the cooling medium.

[Patent Document 1] Japanese Patent Application Laid-Open No. 2001-24372

DISCLOSURE OF THE INVENTION

Problems to be Solved by the Invention

In a case where only one electronic component is to be subjected to heat-release processing, heat can be efficiently transmitted by connecting a heat-absorbing member to the top surface of the electronic component. However, electronic apparatus in which only one electronic component is to be subjected to heat-release processing is rare; most of electronic apparatus is dispersedly provided with plural kinds of electronic components to be subjected to heat-release processing. The plural kinds of electronic components differ from one another in size; when they have been mounted on a printed circuit board, they also differ in height. In electronic apparatus provided with plural electronic components differing in height like this as well, there is a need to efficiently transmit heat generated at the electronic components to a heat-absorbing member.

However, when the conventional method that a plate-shaped heat-absorbing member is made to contact the top surface of an electronic component is applied to electronic apparatus provided with plural electronic components differing in height, contact areas of the heat-absorbing member and the electronic components reduces because the heat-absorbing member is slantingly placed, which causes the problem that heat cannot be transmitted efficiently.

The present invention has been accomplished in view of such circumstances, and therefore an object of the invention is to provide a heat-absorbing member capable of efficiently cooling plural electronic components even when the electronic components to be cooled differ in height, a cooling device provided with the heat-absorbing member, and an electronic apparatus provided with the cooling device.

Means for Solving the Problems

A heat-absorbing member according to the present invention is characterized in that in the plate-shaped heat-absorbing member which absorbs heat from plural electronic components mounted on a support and differing in height, one or more holes are made in the direction of the thickness of the heat-absorbing member in such a way that a tall part of the electronic components are to be fitted in the holes to make contact between the heat-absorbing member and the sides of the tall electronic components.

A heat-absorbing member according to the invention is characterized in that in the heat-absorbing member which absorbs heat from plural electronic components mounted on a support and differing in height, a cooling medium-flow path is provided and one or more holes are made in such a way that a tall part of the electronic components are to be fitted into the holes to make contact between the flow path and the sides of the tall electronic components.

In the heat-absorbing member according to the invention, since the holes into which the tall electronic components are to be fitted are made, the sides of the electronic components fitted thereinto contact the heat-absorbing member. Moreover, the short electronic component contacts the heat-absorbing member at its top surface. Because of this, even when the heat-absorbing member is used with the member horizontally placed, large contact areas can be secured between the heat-absorbing member and all the electronic components differing in height, and therefore heat can be effectively released at all the electronic components. And furthermore, since heat from the electronic components is transmitted using the cooling medium that flows through the provided flow path, the level of cooling capability is high as compared with air cooling devices.

A cooling device according to the invention is characterized in that the cooling device, which cools plural electronic components mounted on a support and differing in height, has a structure in which a plate-shaped heat-absorbing member is provided in which one or more holes are made in the direction of the thickness of the heat-absorbing member in such a way that a tall part of the electronic components are to be fitted into the holes to make contact between the heat-absorbing member and the sides of the tall electronic components and in which the top surfaces of a short part of the electronic components contact the under surface of the heat-absorbing member.

A cooling device according to the invention is characterized in that the cooling device, which cools plural electronic components mounted on a support and differing in height, has a structure in which a heat-absorbing member is provided in which a cooling medium-flow path is provided and one or more holes are made in such a way that a tall part of the electronic components are to be fitted into the holes to make contact between the flow path and the sides of the tall electronic components and in which the top surfaces of a short part of the electronic components contact the under surface of the heat-absorbing member.

In the cooling device according to the invention, the tall electric components are fitted into the holes in the heat-absorbing member to made the contact between the heat-absorbing member and the sides of the electronic components fitted thereinto. That is, the shortest electronic component is made to contact the under surface of the heat-absorbing member at its top surface and the other tall electronic components are made to contact the heat-absorbing member at their sides. Therefore, even when the heat-absorbing member is used with the member horizontally place, sufficiently large contact areas can be secured between the heat-absorbing member and all the electronic components mounted on the support and differing in height, whereby heat can be efficiently released at all the electronic components.

In the above cooling device, a heat conductive body is provided so as to cover the sides of the tall electronic components to be fitted into the holes in the heat-absorbing member. Thus the amount of heat transmitted from the sides of the electronic components to the heat-absorbing member increases, and therefore heat release can be done more efficiently.

An electronic apparatus according to the invention is characterized in that the electronic apparatus is provided with a printed circuit board, plural electronic components mounted on the printed circuit board and differing in height, one or more plate-shaped heat-absorbing members in which one or more holes are made in the direction of the thickness of the heat-absorbing members in such a way that a tall part of the electronic components are fitted into the holes to make contact between the heat-absorbing members and the sides of the tall electronic components and in which the top surfaces of a short part of the electronic components contact the under surface of one of the heat-absorbing members, and a radiator unit that dissipates heat absorbed by the heat-absorbing members to the outside.

Another electronic apparatus according to the invention is provided with a printed circuit board, plural electronic components mounted on the printed circuit board and differing in height, one or more heat-absorbing members in which a cooling medium-flow path is provided and one or more holes are made in the direction substantially perpendicular to the flow path in such a way that a tall part of the electronic components are fitted in the holes to make contact between the heat-absorbing members and the sides of the tall electronic components and in which the top surfaces of a short part of the electronic components contact the under surface of one of the heat-absorbing members, and a radiator unit that dissipates heat absorbed by the heat-absorbing members to the outside.

In the electronic apparatus according to the invention, the tall electronic components fitted into the holes in the heat-absorbing members contact the heat-absorbing members at their sides and the short electronic components contact one of the heat-absorbing members at their top surfaces. Therefore, even when the one or more heat-absorbing members are used with the members horizontally placed, large contact areas can be secured between the heat-absorbing members and all the electronic components mounted on the printed circuit board and differing in height, whereby heat can be efficiently released at all the electronic components. Incidentally, when there is an extremely great step height between electronic components or electronic components are placed in a complex manner, plural heat-absorbing members with holes into which the electronic components are to be fitted can be provided in such a way that the heat-absorbing members differ in placement height.

EFFECTS OF THE INVENTION

In the present invention, tall electronic components are fitted into holes made in a heat-absorbing member. Because of this, even when a single heat-absorbing member has been horizontally placed, the tall electronic components fitted thereinto contact the heat-absorbing member at their sides and a short electronic component contacts the heat-absorbing member at its top surface, and therefore, in any case, a large contact area can be secured, whereby heat from all the electronic components differing in height can be efficiently absorbed into the heat-absorbing member.

In this invention, heat from the electronic components is transmitted by the use of a cooling medium that flows through a flow path provided in the heat-absorbing member, and therefore a high level of cooling capability can be achieved as compared with air cooling devices.

According to the invention, since a heat conductive body is provided so as to cover the tall electronic components to be fitted into the holes in the heat-absorbing member, the amount of the heat transmitted from the sides of the electronic components to the heat-absorbing member can be increased, whereby the heat release can be done more efficiently.

BRIEF DESCRIPTION OF THE DRAWINGS

FIG. 7 is a plan view of a heat-absorbing member according to a third embodiment;

Figure 1:
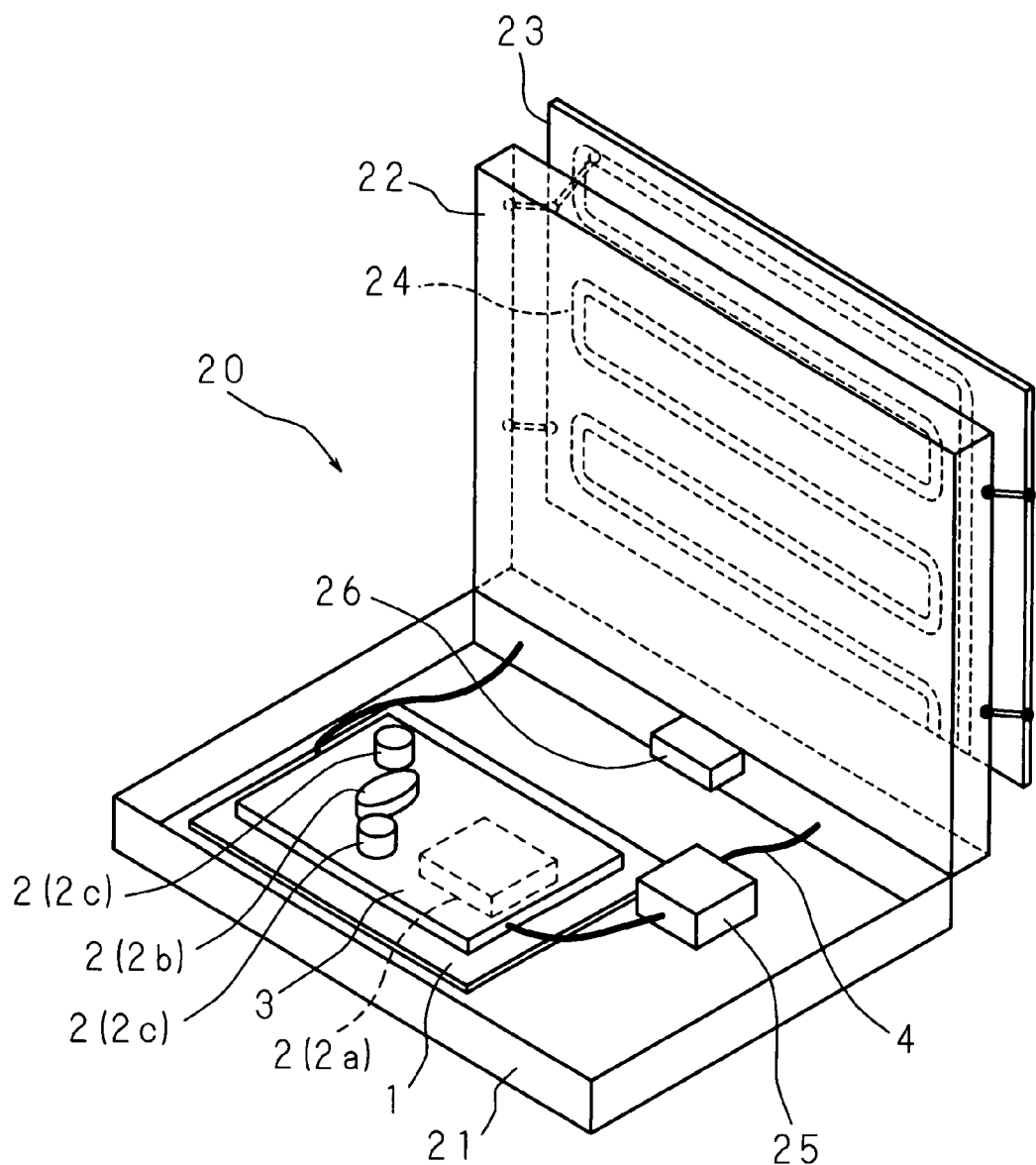
FIG. 1 is a perspective view of an electronic apparatus according to the present invention.

DESCRIPTION OF THE NUMERALS 1 printed circuit board
2 electronic component
2a CPU (electronic component)
2b capacitor (electronic component)
2c coil element (electronic component)
3, 3a, 3b, 3c, and 3d heat-absorbing member
4, 4a, 4b, 4c, and 4d flow path
5b and 5c hole
7b and 7c heat conductive body
10 cooling device
20 electronic apparatus
23 radiator plate

BEST MODES FOR IMPLEMENTING THE INVENTION

The present invention will be specifically described below with reference to the drawings that illustrate some embodiments of the invention; it should be noted that the invention is not limited to the following embodiments.

FIG. 1 is a perspective view of an electronic apparatus according to the invention. The electronic apparatus 20 is a notebook computer, for example. The electronic apparatus 20 according to the invention has a first casing 21 on the side of its main body and a second casing 22 on the side of its display unit.

Plural kinds of electronic components 2(2a, 2b, and 2c) differing in height are dispersedly mounted on a printed circuit board 1 inside the first casing 21. And further, a plate-shaped heat-absorbing member 3 is provided inside the first casing 21 in such a way that the member 3 contacts the top surface of the short electronic component 2(2a) and the sides of the tall electronic components 2(2b and 2c). To circulate a cooling medium such as water, an aqueous solution of propylene glycol, or the like, a flow path 4 is formed in the heat-absorbing member 3, and therefore heat generated at the electronic components 2 is transmitted to the cooling medium in the flow path 4 via the heat-absorbing member 3. The structure of the heat-absorbing member 3 will be described in detail in the following embodiments.

The flow path 4 communicates with a flow path 24 formed in a radiator plate 23 attached to the second casing 22 as a radiator unit. At the midstream of the flow path 4, a pump 25 is provided; by running the pump 25, the cooling medium circulates through the flow paths 4 and 24. Moreover, a fan 26 for sending cooling air between the second casing 22 and the radiator plate 23 is provided inside the first casing 21.

Heat-release processing performed in the electronic apparatus 20 will be described below. The radiator plate 23 is kept open at the time of the heat-release processing. Heat generated at the respective electronic components 2(2a, 2b, and 2c) is transmitted to the cooling medium in the flow path 4 via the heat-absorbing member 3, the cooling medium flows into the flow path 24, and the heat is dissipated from the radiator plate 23 to the outside. At this time, the fan 26 sends cooling air between the second casing 22 and the radiator plate 23, which makes it possible to obtain a greater heat-release effect.

In the following, the structure of a cooling device provided with the heat-absorbing member 3 that is a characteristic part of the invention will be described in detail.

FIRST EMBODIMENT

Figure 2:
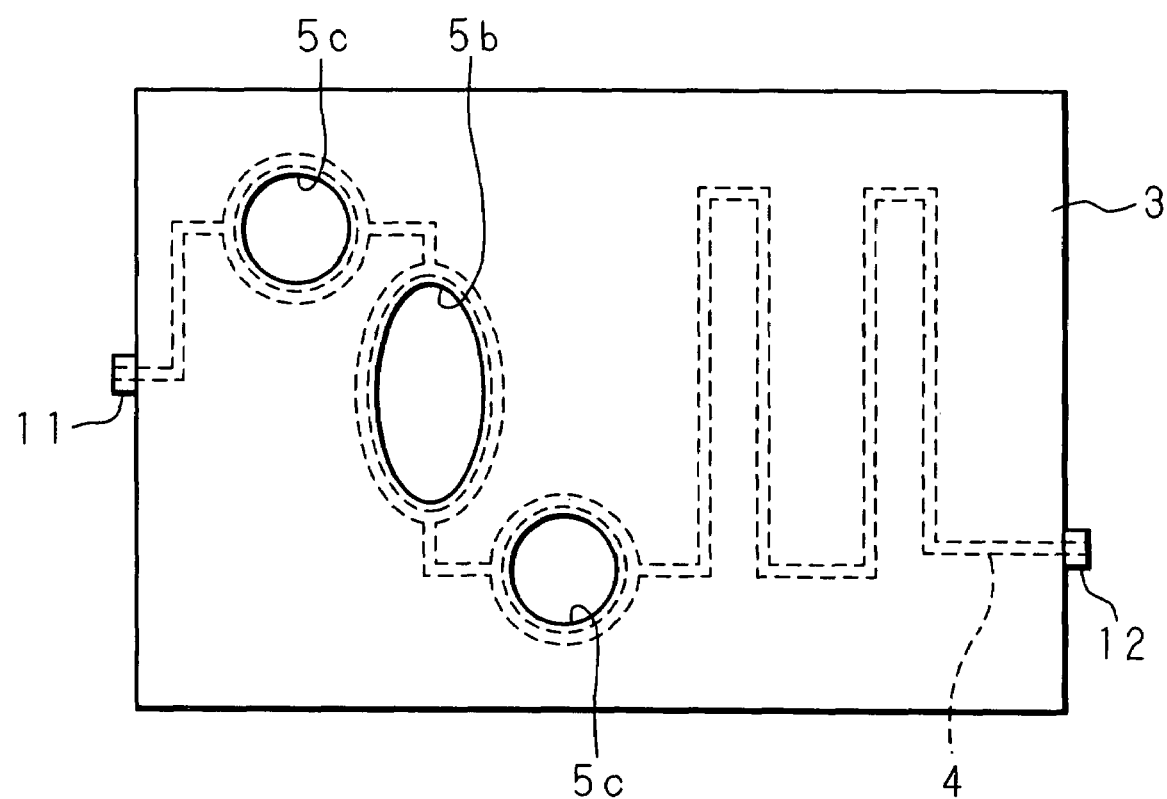
FIG. 2 is a plan view of a heat-absorbing member according to a first embodiment.
Figure 3:
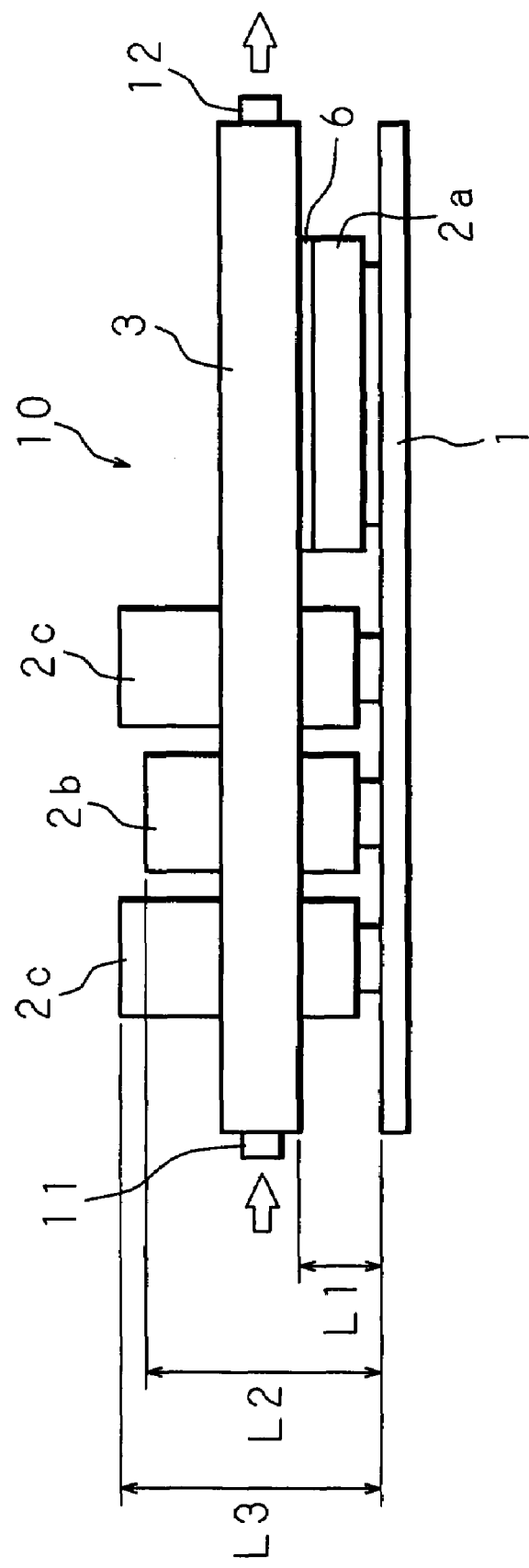
FIG. 3 is a side view of a cooling device according to the first embodiment.
Figure 4:
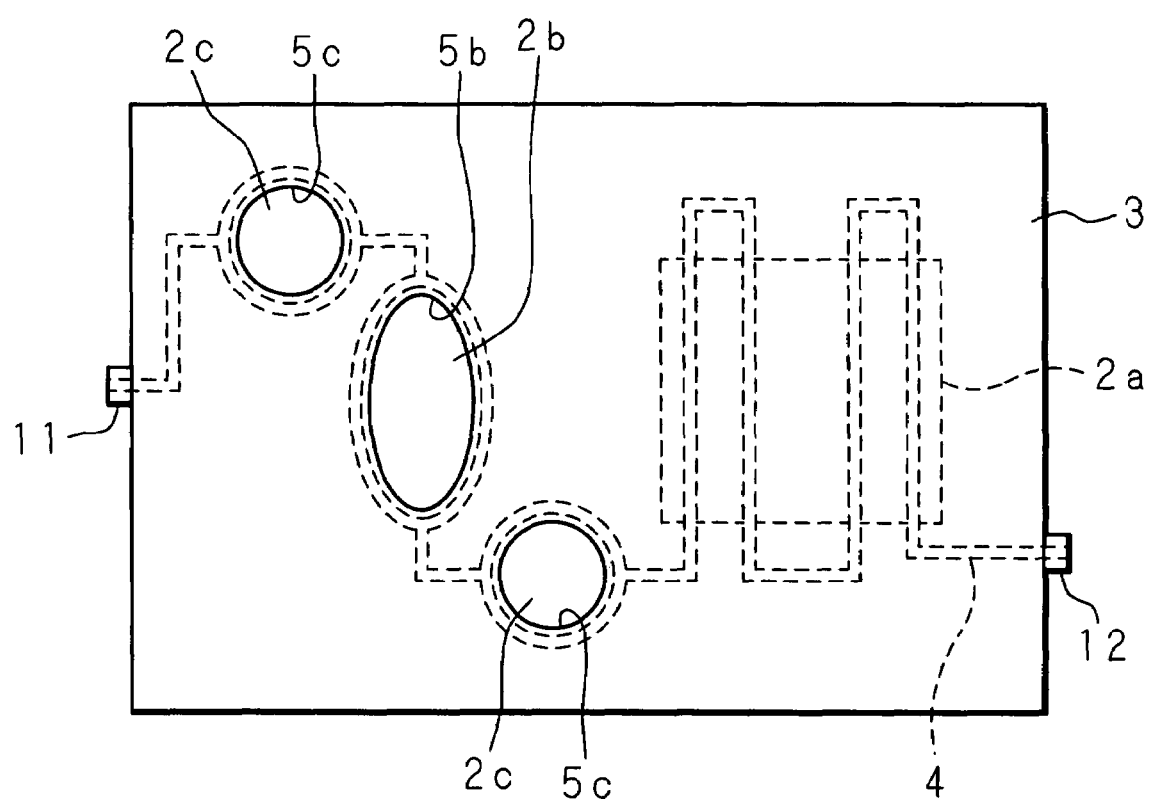
FIG. 4 is a top view of the cooling device according to the first embodiment.

FIG. 2 is a plan view of the heat-absorbing member 3 according to a first embodiment. FIG. 3 is a side view of a cooling device 10 according to the first embodiment. FIG. 4 is a top view of the cooling device 10.

As an example, three kinds of electronic components (a CPU 2a, a capacitor 2b, and coil elements 2c) are mounted on the printed circuit board 1. The heights of the CPU 2a, the capacitor 2b, and the coil elements 2c from the printed circuit board 1 are different from each other; their heights are represented using alphanumeric characters L1, L2, and L3 (L1<L2<L3) respectively. The CPU 2a is the shortest.

The plate-shaped heat-absorbing member 3 is made of a high-thermal-conductivity metal, such as aluminum or copper, and has rigidity. Plural holes 5b and 5c are formed in the heat-absorbing member 3 in such a way that the shapes of the perimeters of the holes 5b and 5c correspond to the shapes of the cross sections of the capacitor 2b and the coil elements 2c which are taller than the CPU 2a, whereby the capacitor 2b and the coil elements 2c can be fitted into the holes 5b and 5c respectively. And further, the heat-absorbing member 3 is provided above the printed circuit board 1 in such a way that it contacts not only the top surface of the CPU 2a that is the shortest via a thermal jointing material 6 but the sides of the capacitor 2b and the coil elements 2c by fitting them into the holes 5b and 5c.

Moreover, to circulate a cooling medium such as an aqueous solution of propylene glycol, the flow path 4 with an inlet 11 and an outlet 12 is formed in the heat-absorbing member 3. On the peripheries of the capacitor 2b and the coil elements 2c, the flow path 4 is formed in such a way that the flow path 4 surrounds them; in the vicinity of the CPU 2a, the flow path 4 is meanderingly formed above the CPU 2a. The holes 5b and 5c are formed in the direction of the thickness of the heat-absorbing member 3, that is, in a direction substantially perpendicular to the flow path 4.

Incidentally, the cooling device 10 having such a structure is fabricated by placing the heat-absorbing member 3 above the printed circuit board 1 on which the electronic components (the CPU 2a, the capacitor 2b, and the coil elements 2c) are mounted in such a way that the capacitor 2b and the coil elements 2c are fitted into the holes 5b and 5c respectively.

Heat-release processing by the cooling device 10 will be described below. Heat generated at the CPU 2a is transmitted from the top surface of the CPU 2a to the cooling medium in the flow path 4 via the heat-absorbing member 3. On the other hand, heat generated at the capacitor 2b and the coil elements 2c is transmitted from their sides to the cooling medium in the flow path 4 via the heat-absorbing member 3. The cooling medium flows into the flow path 24, whereby the heat is dissipated from the radiator plate 23 to the outside (see FIG. 1).

In the cooling device 10 according to the first embodiment, the short electronic component (the CPU 2a) contacts the heat-absorbing member 3 at its top surface, but the tall electronic components (the capacitor 2b and the coil elements 2c) contact the heat-absorbing member 3 at their sides because they are fitted into the holes 5b and 5c in the heat-absorbing member 3. On account of this, even when the heat-absorbing member 3 is placed horizontally (parallel to the printed circuit board 1), sufficiently large contact areas can be secured between the heat-absorbing member 3 and all the electronic components (the CPU 2a, the capacitor 2b, and the coil elements 2c) mounted on the printed circuit board 1 and differing in height, which makes it possible to efficiently release heat at all the electronic components.

SECOND EMBODIMENT

Figure 5:
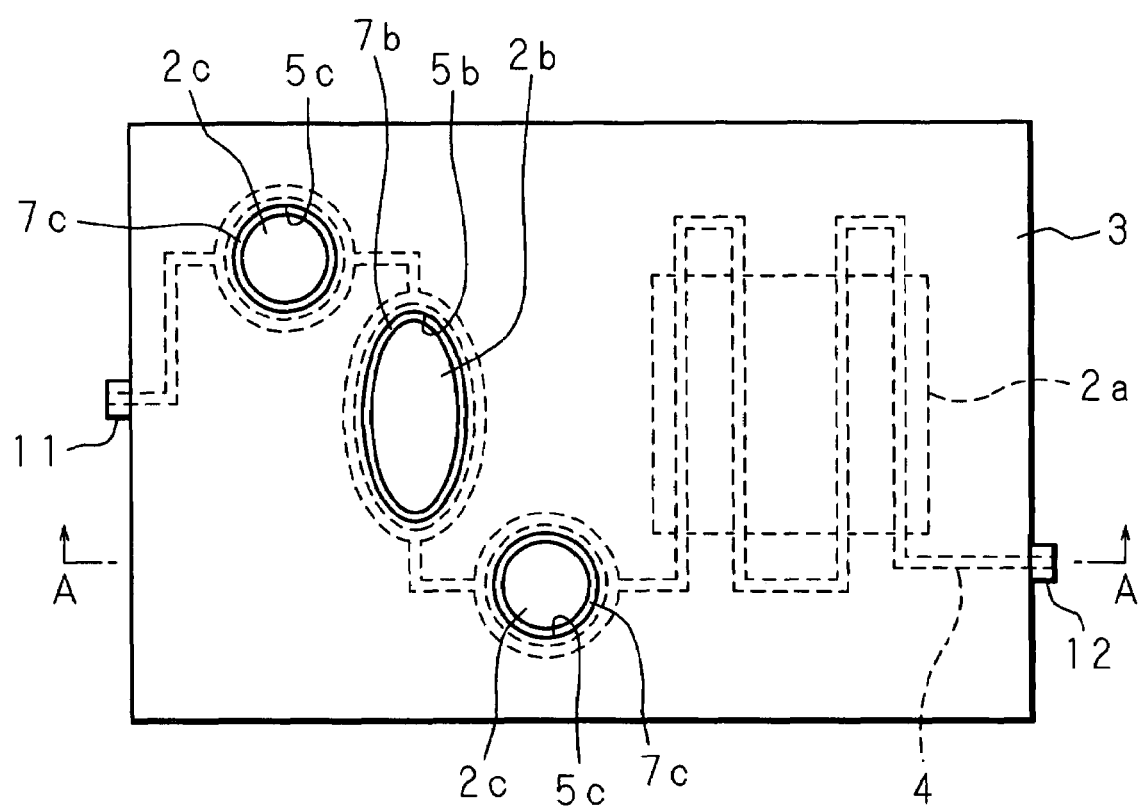
FIG. 5 is a top view of a cooling device according to a second embodiment.
Figure 6:
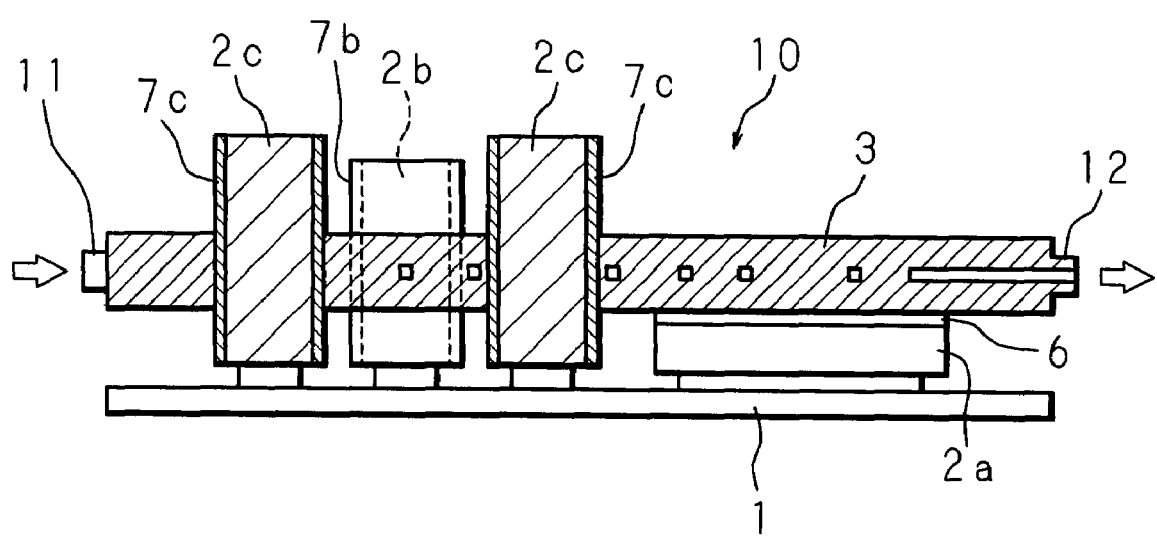
FIG. 6 is a cross-sectional view of the cooling device taken along line A-A of FIG. 5.

FIG. 5 is a top view of the cooling device 10 according to a 15 second embodiment. FIG. 6 is a cross-sectional view of the cooling device 10 taken along line A-A of FIG. 5. In FIGS. 5 and 6, components which are identical with or the same as those of FIGS. 1 to 4 are represented using the same reference numerals.

In the second embodiment, a tubular heat conductive body 7b and tubular heat conductive bodies 7c are provided in such a way that the entire side of the tall electronic component (the capacitor 2b) fitted into the hole 5b in the heat-absorbing member 3 is covered with the heat conductive body 7b and the entire sides of the other tall electronic components (the coil elements 2c) fitted into the holes 5c in the heat-absorbing material 3 are covered with the heat conductive bodies 7c. The heat conductive bodies 7b and 7c, like the heat-absorbing member 3, are made of a high-thermal-conductivity metal such as aluminum or copper.

Incidentally, the cooling device 10 having such a structure is fabricated by fitting the heat conductive bodies 7b and 7c to the sides of the capacitor 2b and the coil elements 2c mounted on the printed circuit board 1 and then placing the heat-absorbing member 3 above the printed circuit board 1 in such a way that the capacitor 2b fitted at its side with the heat conductive body 7b is fitted into the hole 5b and the coil elements 2c fitted at their sides with the heat conductive bodies 7c are fitted into the holes 5c.

Heat-release processing by the cooling device 10 will be described below. As in the case of the first embodiment, heat generated at the CPU 2a is transmitted from its top surface to the cooling medium in the flow path 4 via the heat-absorbing member 3. On the other hand, heat generated at the capacitor 2b and the coil elements 2c is transmitted from their sides to the cooling medium in the flow path 4 via the heat conductive bodies 7b and 7c and the heat-absorbing member 3. The cooling medium flows into the flow path 24, whereby the heat is dissipated from the radiator plate 23 to the outside (see FIG. 1).

In the cooling device 10 according to the second embodiment, there is no doubt that it is possible to obtain the same effect as that described in the first embodiment that heat can be efficiently released at all the electronic components differing in height.

Moreover, since the heat conductive body 7b is fitted to the side of the tall capacitor 2b and the heat conductive bodies 7c are fitted to the sides of the tall coil elements 2c, the amount of heat absorbed from their sides into the heat-absorbing member 3 is increased, and therefore heat release can be done more efficiently.

THIRD EMBODIMENT

Figure 8:
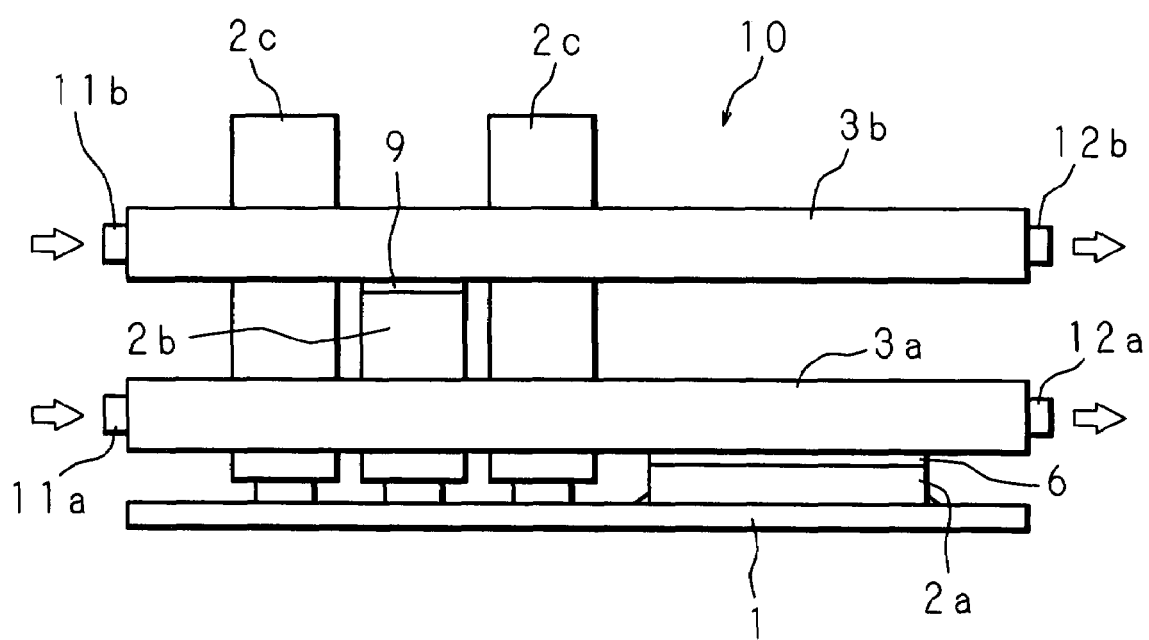
FIG. 8 is a side view of a cooling device according to the third embodiment.
Figure 9:
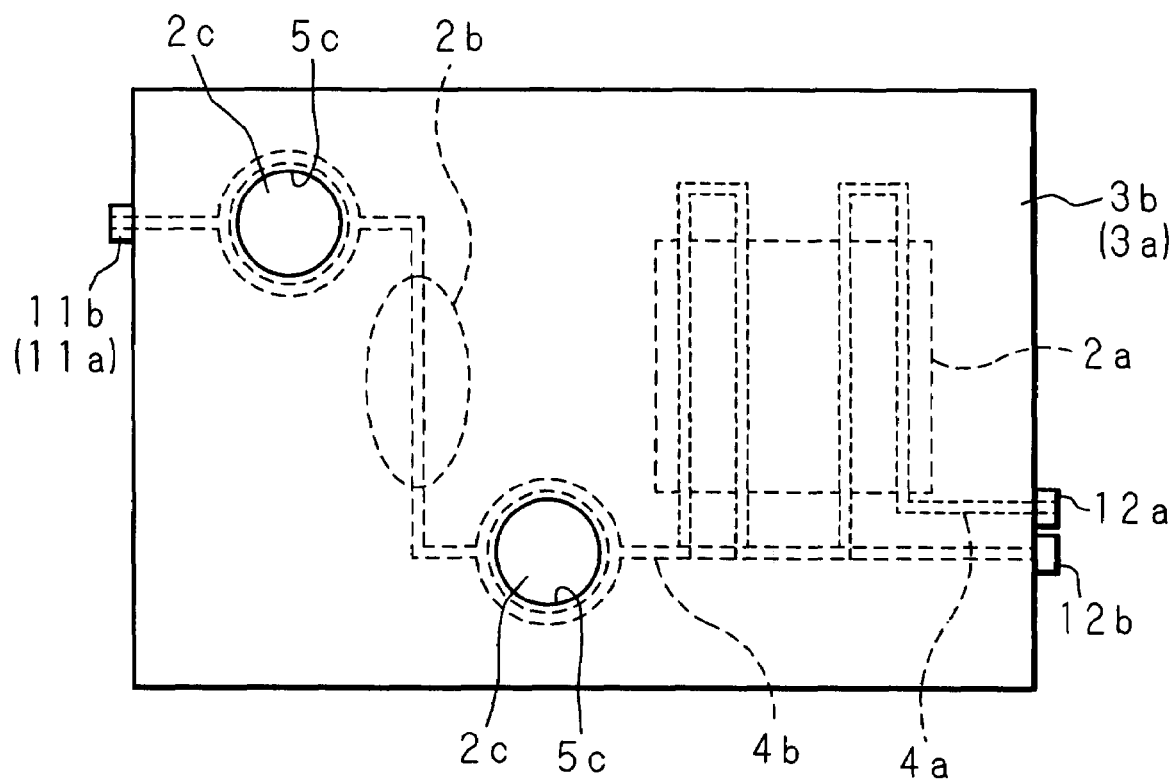
FIG. 9 is a top view of the cooling device according to the third embodiment.

FIG. 7(a) is a plan view of a heat-absorbing member 3a according to a third embodiment and FIG. 7(b) is a plan view of a heat-absorbing member 3b according to the third embodiment. FIG. 8 is a side view of the cooling device 10 according to the third embodiment and FIG. 9 is a top view of the cooling device 10. In FIGS. 7 to 9, components which are identical with or the same as those of FIGS. 1 to 6 are presented using the same reference numerals.

In the third embodiment, there is a great step height between the electronic components (the CPU 2a and the coil elements 2c) mounted on the printed circuit board 1. According to the third embodiment, the two plate-shaped heat-absorbing members 3a and 3b, which are made of a high-thermal-conductivity metal such as aluminum or copper, are provided as two-step heat-absorbing members with their placement heights different from each other.

As in the case of the above heat-absorbing member 3, the placement height of the lower (first-step) heat-absorbing member 3a is substantially equal to the height of the CPU 2a which is the shortest of all the electronic components. The placement height of the upper (second-step) heat-absorbing member 3b is substantially equal to the height of the capacitor 2b. The holes 5b and 5c are made in the first-step heat-absorbing member 3a in such a way that the shape of the perimeter of the hole 5b corresponds to the shape of the cross section of the capacitor 2b and the shape of the perimeters of the holes 5c corresponds to the shape of the cross sections of the coil elements 2c, and therefore the capacitor 2b and the coil elements 2c can be fitted into the holes 5b and 5c respectively (see FIG. 7(a)). The holes 5c are made in the upper (second-state) heat-absorbing member 3b in such a way that the shape of the perimeters of the holes 5c corresponds to the shape of the cross sections of the tallest coil elements 2c, and therefore the coil elements 2c can be fitted into the holes 5c (see FIG. 7(b)).

Moreover, in order to circulate a cooling medium, a flow path 4a with an inlet 11a and an outlet 12a is formed in the heat-absorbing member 3a; in order to circulate a cooling medium, a flow path 4b with an inlet 11b and an outlet 12b is formed in the heat-absorbing member 3b. In the vicinity of the CPU 2a, the flow path 4a is meanderingly formed above the CPU 2a; on the peripheries of the capacitor 2b and the coil elements 2c, the flow path 4a is formed in such a way that the flow path 4a surrounds them. On the peripheries of the coil elements 2c, the flow path 4b is formed in such a way that the path 4b surrounds them. The flow paths 4a and 4b communicate with the flow path 24 in the radiator plate 23 with both flow paths 4a and 4b joining with each other.

Furthermore, as in the case of the above heat-absorbing member 3, the first-step heat-absorbing member 3a is placed above the printed circuit board 1 in such a way that it contacts not only the top surface of the shortest CPU 2a via the thermal jointing material 6 but the sides of the capacitor 2b and the coil elements 2c by fitting them into the holes 5b and 5c; and besides the second-step heat-absorbing member 3b is placed above the first-step heat-absorbing member 3a in such a way that it contacts not only the top surface of the capacitor 2b via a thermal jointing material 9 but the sides of the coil elements 2c by fitting the elements 2c into the holes 5c.

Heat-release processing by the cooling device 10 will be described below. Heat generated at the CPU 2a is transmitted from its top surface to the cooling medium in the flow path $4a$ via the heat-absorbing member $3a$; heat generated at the lower parts of the capacitor $2b$ and the coil elements $2c$ is transmitted from their sides to the cooling medium in the flow path $4a$ via the heat-absorbing member $3a$. Heat generated at the upper part of the capacitor $2b$ is transmitted from its top surface to the cooling medium in the flow path $4b$ via the heat-absorbing member $3b$; heat generated at the upper parts of the coil elements $2c$ is transmitted from their sides to the cooling medium in the flow path $4b$ via the heat-absorbing member $3b$. Both cooling mediums flow into the flow path $24$ together, whereby the heat is dissipated from the radiator plate $23$ to the outside (see FIG. 1).

When plural electronic components extremely differ in height, it is difficult to absorb heat generated at the upper parts of tall ones of the electronic components. For this reason, the cooling device 10 according to the third embodiment is provided with the plural-step heat-absorbing member so that heat generated at the upper parts of the electronic components can be readily absorbed by the heat-absorbing member $3b$.

FOURTH EMBODIMENT

Figure 10:
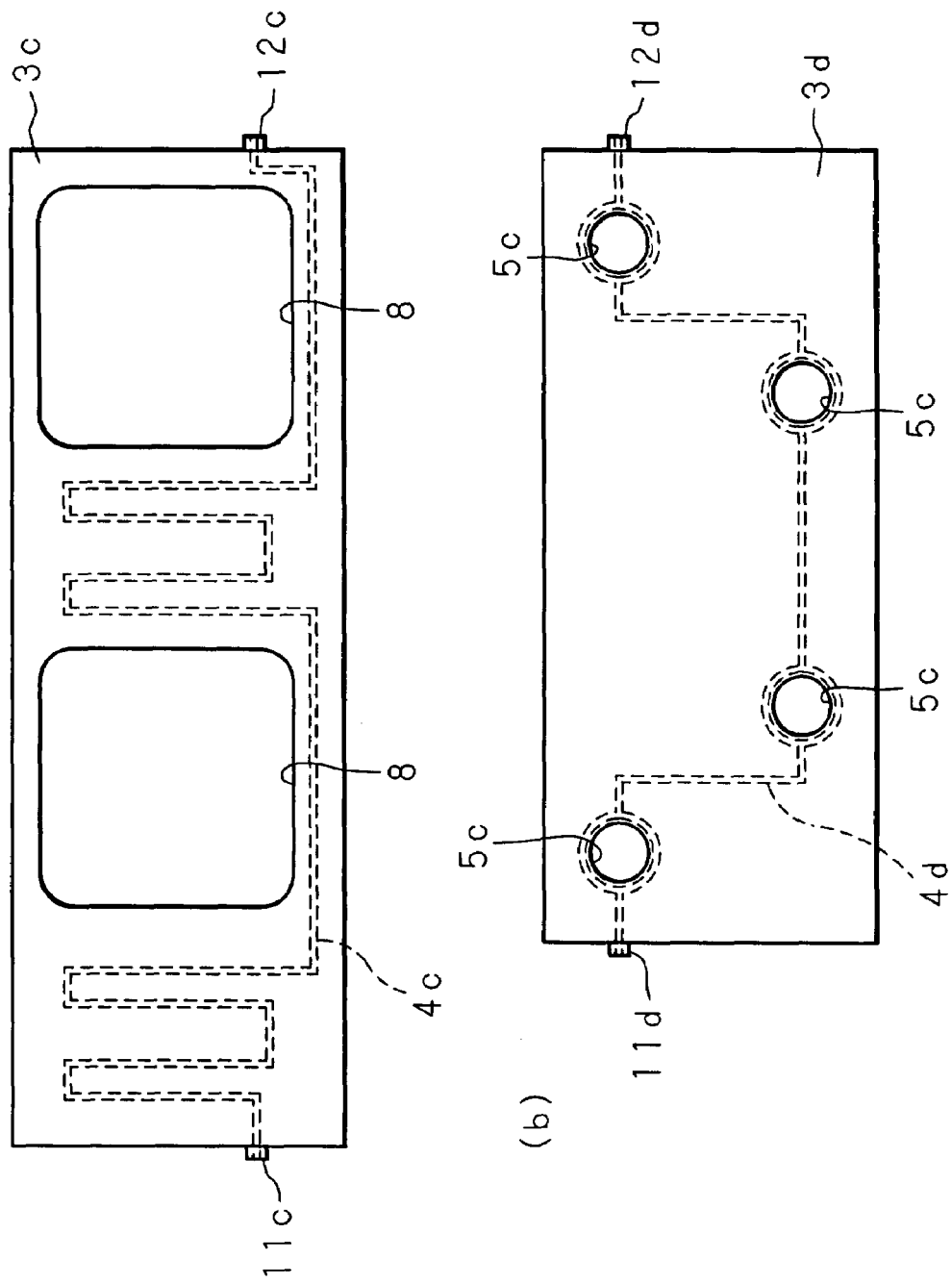
FIG. 10 is a plan view of a heat-absorbing member according to a fourth embodiment.
Figure 11:
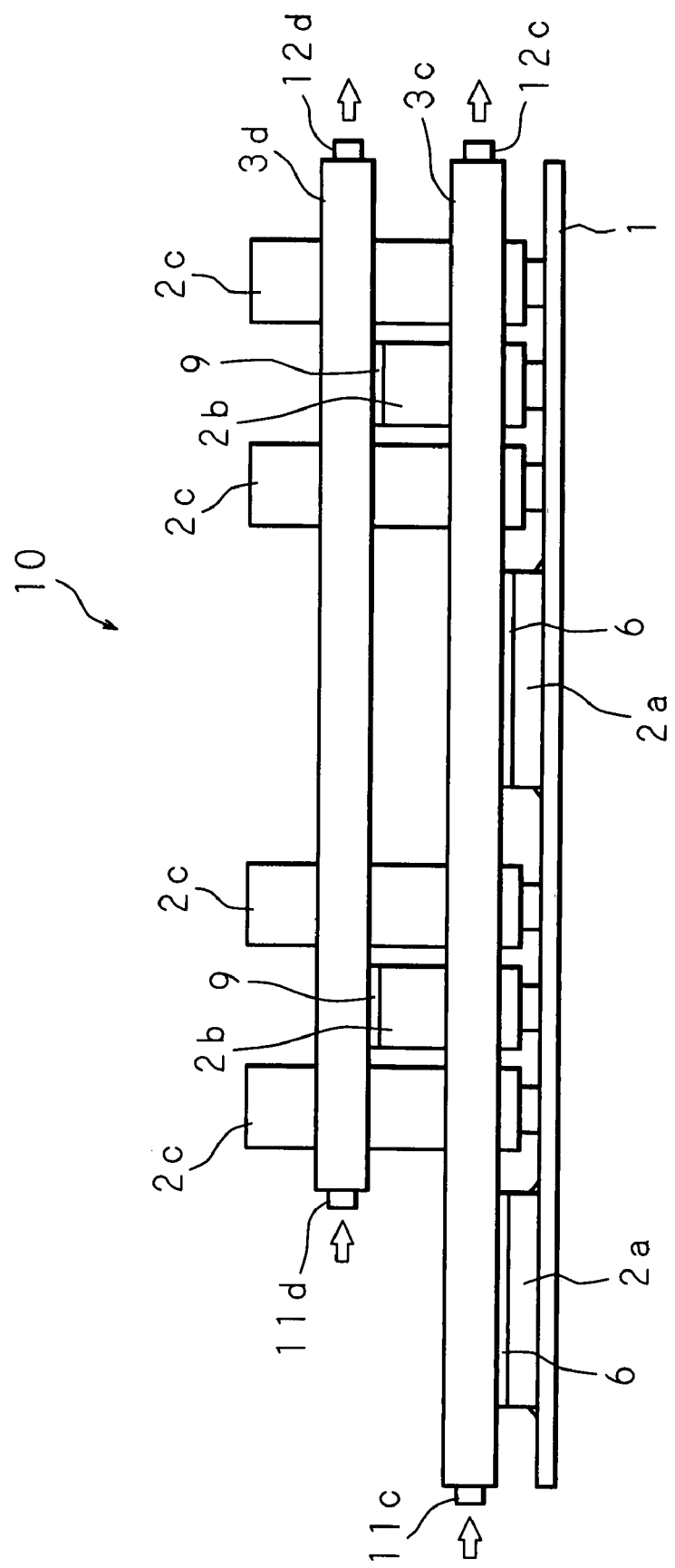
FIG. 11 is a side view of a cooling device according to the fourth embodiment.

FIG. 10($a$) is a plan view of a heat-absorbing member $3c$ according to a fourth embodiment; FIG. 10($b$) is a plan view of a heat-absorbing member $3d$ according to the fourth embodiment. FIG. 11 is a side view of the cooling device 10 according to the fourth embodiment. In FIGS. 10 and 11, components which are identical with or the same as those of FIGS. 1 to 9 are represented using the same reference numerals. In the fourth embodiment, as in the case of the third embodiment, two plate-shaped heat-absorbing members $3c$ and $3d$ are provided as first-step and second-step heat-absorbing members that differ in placement height.

Two large openings 8 are made in the first-step heat-absorbing member $3c$ so that the capacitor $2b$ and the coil elements $2c$ pass through each of the openings 8 together (see FIG. 10($a$)). The holes $5c$ are made in the upper (second-step) heat-absorbing member $3d$ in such a way that the shape of the perimeters of the holes $5c$ corresponds to the shape of the cross sections of the coil elements $2c$ that are the tallest, and therefore the coil elements $2c$ can be fitted into the holes $5c$ (see FIG. 10($b$)).

Moreover, in order to circulate a cooling medium, a flow path $4c$ with an inlet $11c$ and an outlet $12c$ is formed in the heat-absorbing member $3c$; in order to circulate a cooling medium, a flow path $4d$ with an inlet $11d$ and an outlet $12d$ is formed in the heat-absorbing member $3d$. In the vicinities of the CPUs $2a$, the flow path $4c$ is meanderingly formed above them; on the peripheries of the coil elements $2c$, the flow path $4d$ is formed in such a way that the flow path $4d$ surrounds them. The flow paths $4c$ and $4d$ communicate with the flow path $24$ in the radiator plate $23$ with both flow paths $4c$ and $4d$ joining with each other.

Further, as in the case of the above heat-absorbing member 3, the first-step heat-absorbing member $3c$ is placed above the printed circuit board 1 in such a way that it contacts the top surfaces of the CPUs $2a$ that are the shortest via the thermal jointing materials 6 and that the capacitor $2b$ and the coil elements $2c$ pass through each of the openings 8 together. Furthermore, the second-step heat-absorbing member $3d$ is placed above the heat-absorbing member $3c$ in such a way that it contacts not only the top surfaces of the capacitors $2b$ via the thermal jointing materials 9 but the sides of the coil elements $2c$ by fitting the coil elements $2c$ into the holes $5c$.

Heat-release processing by the cooling device 10 will be described below. Heat generated at the CPUs $2a$ is transmitted from their top surfaces to the cooling medium in the flow path $4c$ via the heat-absorbing member $3c$. Heat generated at the capacitors $2b$ is transmitted from their top surfaces to the cooling medium in the flow path $4d$ via the heat-absorbing member $3d$. Heat generated at the coil elements $2c$ is transmitted from their sides to the cooling medium in the flow path $4d$ via the heat-absorbing member $3d$. The cooling mediums flow into the flow path $24$ together, whereby the heat is dissipated from the radiator plate $23$ to the outside (see FIG. 1).

In the cooling device 10 according to the fourth embodiment, the heat-absorbing member $3c$, which absorbs heat from the CPUs $2a$ having a high calorific value, and the heat-absorbing $3d$, which absorbs heat from the capacitors $2b$ and the coil elements $2c$ having not-so-high calorific values, are independently provided, and therefore heat-absorption processing can be done without interference between heat absorbed by the heat-absorbing member $3c$ and heat absorbed by the heat-absorbing member $3d$ being caused.

In the cooling devices 10 according to the third and fourth embodiments, there is no doubt that it is possible to obtain the same effect as that described in the first and second embodiments that heat can be efficiently released at all the electronic components differing in height. Furthermore, even when there is an extremely great step height between electronic components or when plural electronic components are placed in a complex manner, heat generated at the electronic components can be effectively absorbed by making a heat-absorbing member have the above plural-step blanking structure, whereby heat-release properties can be improved.

In the individual embodiments described above, the cooling medium-flow path is formed in the heat-absorbing member; however, it should be noted that even if the flow path is not formed, the heat-absorbing member has only to have a structure in which the holes through which the electronic components are to be fitted are made to make the contact between the heat-absorbing member and the sides of the electronic components. Therefore there is no doubt that the invention is also applicable to heat-absorbing members having such a structure.

In addition, in the individual embodiments described above, although the heat-absorbing member is rectangular, its shape can be determined in accordance with a mounting pattern for the electronic components because the cooling device has only to have the heat-absorbing member only at a region where the electronic components are present. In such a case, the volume of the heat-absorbing member decreases, and therefore the production cost of the cooling device can be reduced.

What is claimed is:

1. A plate-shaped heat-absorbing member which absorbs heat from electronic components mounted on a support and differing in height,
    there being one or more through holes in the heat-absorbing member in the direction of thickness of the heat-absorbing member, the one or more through holes being configured to receive at least a portion of the electronic components and contact sides of the electronic components when the portion of the electronic components are disposed within the one or more through holes.

2. A heat-absorbing member which absorbs heat from plural electronic components mounted on a support and differing in height, wherein
    a cooling medium-flow path is provided and one or more holes are made in such a way that a tall part of the electronic components are to be fitted into the holes to make contact between the flow path and the sides of the tall electronic components.

3. A cooling device which cools electronic components mounted on a support and differing in height, comprising:
a plate-shaped heat-absorbing member configured with one or more through holes in the direction of thickness of the heat-absorbing member, the one or more through holes being configured to receive at least a portion of the electronic components and contact sides of the electric components when the portion of the electronic components are disposed within the one or more through holes.

4. A cooling device which cools plural electronic components mounted on a support and differing in height, comprising:
a heat-absorbing member, in which a cooling medium-flow path is provided, one or more holes are made in such a way that a tall part of the electronic components are to be fitted into the holes to make contact between the flow path and the sides of the tall electronic components;
wherein the top surfaces of a short part of the electronic components contact the under surface of the heat-absorbing member.

5. An electronic apparatus, comprising:
a printed circuit board;
electronic components mounted on the printed circuit board and differing in height;
one or more plate-shaped heat-absorbing members configured with one or more through holes in the direction of thickness of the one or more heat-absorbing members, the one or more through holes being configured to receive at least a portion of the electronic components and contact sides of the electronic components when the portion of the electronic components are disposed within the one or more through holes.

6. The heat-absorbing member according to claim 1, wherein the heat absorbing member contacts upper surfaces of shorter electronic components and side surfaces of taller electronic components.

7. The heat-absorbing member according to claim 1, further comprising:
a cooling-medium flow path and at least a portion of the cooling medium flow path surrounds the one or more through holes to cool electronic components disposed within the one or more through holes.

8. The cooling device according to claim 3, wherein the heat absorbing member contacts upper surfaces of shorter electronic components and side surfaces of taller electronic components.

9. The cooling device according to claim 8, wherein upper surfaces of the shorter electronic components contact an under surface of the heat-absorbing member.

10. The cooling device according to claim 3, wherein the heat-absorbing member includes a cooling-medium flow path and at least a portion of the cooling medium flow path surrounds the one or more through holes to cool electronic components disposed within the one or more through holes.

11. The electronic apparatus according to claim 5, wherein the heat-absorbing member is plate-shaped.

12. The electronic apparatus according to claim 5, wherein the heat-absorbing member contacts upper surfaces of shorter electronic components and side surfaces of taller electronic components.

13. The electronic apparatus according to claim 5, wherein the heat-absorbing member includes a cooling-medium flow path and at least a portion of the cooling medium flow path surrounds the one or more through holes to cool electronic components disposed within the one or more through holes.

14. The electronic apparatus according to claim 5, further comprising:
a radiator unit to dissipates heat absorbed by the heat-absorbing members.

* * * * *